United States Patent
Yang (10) Patent No.: US 11,657,881 B2
(45) Date of Patent: May 23, 2023

(54) DYNAMIC REFERENCE CURRENT MEMORY ARRAY AND METHOD

(71) Applicant: TAIWAN SEMICONDUCTOR MANUFACTURING COMPANY, LTD., Hsinchu (TW)

(72) Inventor: Tien-Chun Yang, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 109 days.

(21) Appl. No.: 17/383,089

(22) Filed: Jul. 22, 2021

(65) Prior Publication Data

US 2021/0350860 A1  Nov. 11, 2021

Related U.S. Application Data

(63) Continuation of application No. 16/774,938, filed on Jan. 28, 2020, now Pat. No. 11,094,384, which is a
(Continued)

(51) Int. Cl.
G11C 16/28 (2006.01)
G11C 7/06 (2006.01)
(Continued)

(52) U.S. Cl.
CPC .......... *G11C 16/28* (2013.01); *G11C 7/00* (2013.01); *G11C 7/062* (2013.01); *G11C 7/14* (2013.01); *G11C 11/1673* (2013.01); *G11C 11/5642* (2013.01); *G11C 16/30* (2013.01); *G11C 16/349* (2013.01); *G11C 29/021* (2013.01); *G11C 29/028* (2013.01); *H03K 5/2472* (2013.01); *G11C 5/02* (2013.01); *G11C 7/065* (2013.01)

(58) Field of Classification Search
CPC .. G11C 7/062; G11C 7/00; G11C 7/14; G11C 16/349; G11C 29/021; G11C 29/028; G11C 11/5642; G11C 16/28; G11C 11/1673; G11C 7/065; G11C 5/02; H03K 5/2472
See application file for complete search history.

(56) References Cited

U.S. PATENT DOCUMENTS

5,886,546 A  3/1999 Hwang
6,215,697 B1  4/2001 Lu
(Continued)

*Primary Examiner* — Ajay Ojha
(74) *Attorney, Agent, or Firm* — Hauptman Ham, LLP (57) ABSTRACT

A memory array includes a plurality of column segments, each column segment including a plurality of columns of memory cells, a plurality of sense amplifiers selectively coupled to each column of the plurality of columns of a corresponding column segment, pluralities of first and second reference cells, and a reference current circuit. The reference current circuit generates a reference current based on a first current generated by a first reference cell programmed to a low logical value and a second current generated by a second reference cell programmed to a high logical value. Each sense amplifier generates a mirror current based on the reference current, and a logical value based on a comparison of the mirror current to a cell current received from a memory cell of a column of the plurality of columns of the corresponding column segment.

20 Claims, 5 Drawing Sheets

Related U.S. Application Data continuation of application No. 16/022,688, filed on Jun. 29, 2018, now Pat. No. 10,553,288, which is a continuation of application No. 15/587,039, filed on May 4, 2017, now Pat. No. 10,020,064, which is a continuation of application No. 14/024,109, filed on Sep. 11, 2013, now Pat. No. 9,666,246.

(51) Int. Cl.
| | | |
|---|---|---|
| *G11C 11/16* | (2006.01) | |
| *G11C 7/00* | (2006.01) | |
| *G11C 7/14* | (2006.01) | |
| *G11C 11/56* | (2006.01) | |
| *G11C 16/34* | (2006.01) | |
| *G11C 29/02* | (2006.01) | |
| *G11C 16/30* | (2006.01) | |
| *G11C 5/02* | (2006.01) | |
| *H03K 5/24* | (2006.01) | |

(56) References Cited

U.S. PATENT DOCUMENTS

| | | |
|---|---|---|
| 6,462,998 B1 | 10/2002 | Proebsting |
| 6,466,059 B1 | 10/2002 | Gaibotti |
| 7,116,597 B1 | 10/2006 | Goldman |
| 2004/0266107 A1 | 12/2004 | Chindalore |
| 2005/0063236 A1 | 3/2005 | Pagliato et al. |
| 2006/0023531 A1 | 2/2006 | Crippa |
| 2006/0126374 A1 | 6/2006 | Waller et al. |
| 2007/0030729 A1 | 2/2007 | Chan |
| 2007/0109841 A1 | 5/2007 | Lin et al. |
| 2007/0242517 A1* | 10/2007 | Honda ............... G11C 16/3459 365/185.21 |
| 2008/0002481 A1 | 1/2008 | Gogl et al. |
| 2008/0273394 A1 | 11/2008 | Kern |
| 2009/0273998 A1 | 11/2009 | Mu et al. |
| 2012/0292679 A1 | 11/2012 | Funayama |
| 2013/0070519 A1 | 3/2013 | Lin et al. |
| 2017/0084825 A1 | 3/2017 | Tsunoda |

\* cited by examiner

DYNAMIC REFERENCE CURRENT MEMORY ARRAY AND METHOD

PRIORITY CLAIM

The present application is a continuation of U.S. application Ser. No. 16/774,938, filed Jan. 28, 2020, which is a continuation U.S. application Ser. No. 16/022,688, filed Jun. 29, 2018, now U.S. Pat. No. 10,553,288, issued Feb. 4, 2020, which is a continuation of U.S. application Ser. No. 15/587,039, filed May 4, 2017, now U.S. Pat. No. 10,020,064, issued Jul. 10, 2018, which is a continuation of U.S. application Ser. No. 14/024,109, filed Sep. 11, 2013, now U.S. Pat. No. 9,666,246, issued May 30, 2017, which are incorporated herein by reference in their entireties.

FIELD

The present disclosure is related to sensing data based on a dynamic reference current.

BACKGROUND

In an approach, a fixed value of a reference current is used in sensing data for a metal-oxide nitride-oxide semiconductor (MONOS) flash memory cells. For illustration, a flash memory cell is called a flash cell, a memory cell, etc. Further, a sense amplifier compares the value of the flash cell current with the value of the reference current. If the value of the cell current is higher than that of the reference current, the data stored in the flash cell is logically high. But if the value of the cell current is lower than that of the reference current, the data stored in the flash cell is logically low. After the flash cell is programmed and erased many times, such as over about 10,000 times, the flash cell experiences a charge loss. As a result, the cell current decreases. In contrast, the fixed value of the reference current stays the same. Consequently, the data revealed by the sense amplifier could be inaccurate.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. In some embodiments, data sensing is based on a dynamic reference current. The reference current is dynamic because it varies as the current in a corresponding flash memory cell varies. As a result, the sense or read margin increases.

Figure 1:
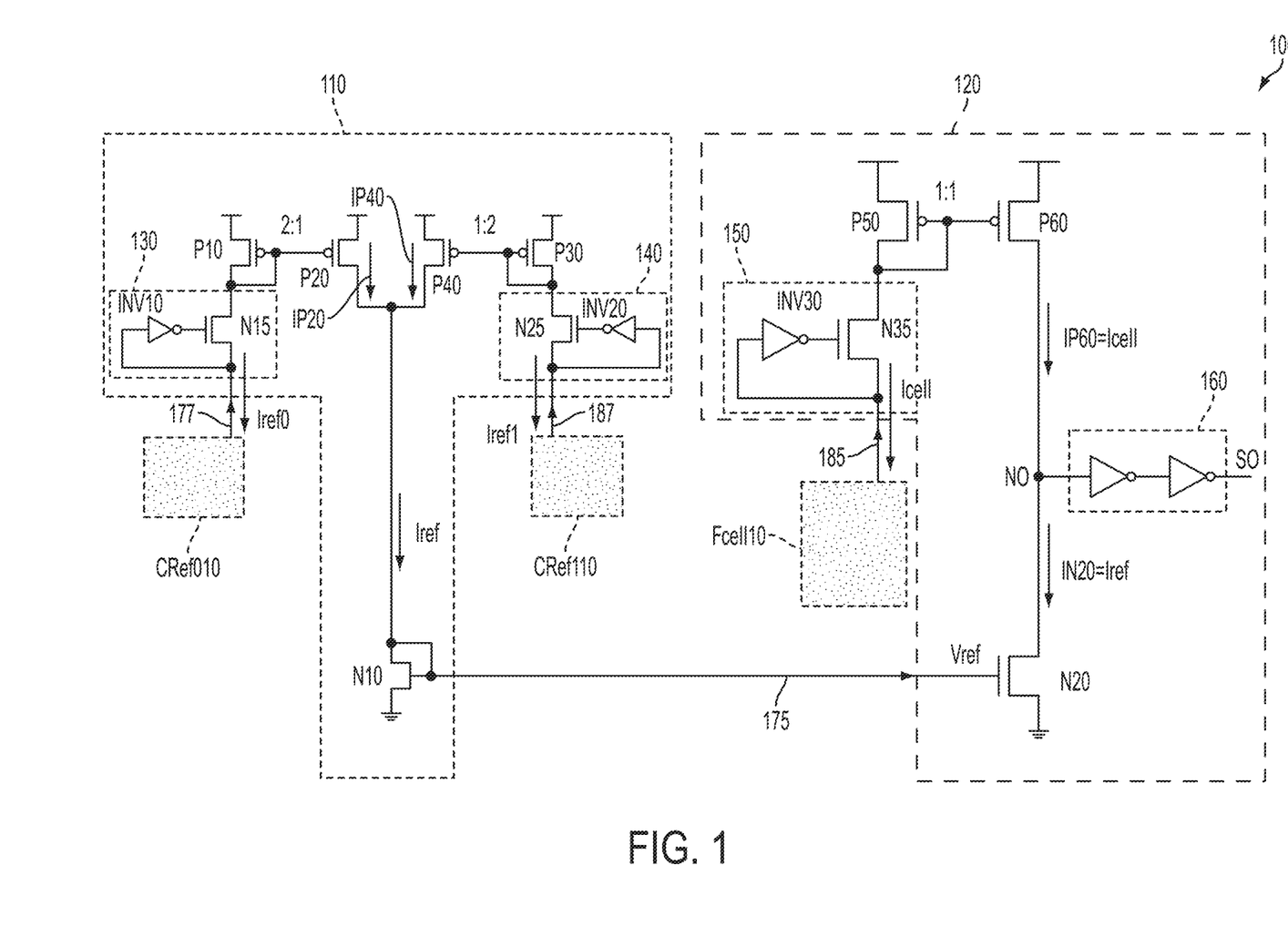
FIG. 1 is a diagram of a circuit used to illustrate dynamic current sensing, in accordance with some embodiments.

FIG. 1 is a diagram of a circuit 100, in accordance with some embodiments. Circuit 100 is used to illustrate operations of a sense amplifier 120, which senses a current Icell of a flash memory cell Fcell10 based on a reference current Iref generated by a reference current generating circuit 110.

Flash Memory Cell

In some embodiments, flash memory cell Fcell10 is manufactured based on metal-oxide nitride-oxide semiconductor (MONOS) technology. After Fcell10 is manufactured, Fcell10 stores a "neutral" logical value, which is not a low logical nor a high logical value. So that Fcell10 stores a low logical value, electrons are injected into the source side of flash cell Fcell10. In other words, injecting electrons into Fcell10 programs Fcell10 with a low logical value. So that Fcell10 stores a high logical value, Fcell10 is programmed with a low logical value, and the low logical value is then erased to result in a high logical value.

When Fcell10 is accessed, Fcell10 draws a current Icell. A value of Icell depends on a logical value stored in Fcell10. For example, if Fcell10 stores a low logical value, Icell is relatively low, compared with reference current Iref. In contrast, if current Fcell10 stores a high logical value, Icell is relatively high compared with Iref. In some embodiments, sense amplifier 120 compares a value of Icell with a value of Iref. If the value of Icell is less than the value of Iref, Fcell10 stores a low logical value. But if the value of Icell is greater than the value of Iref, Fcell10 stores a high logical value.

Figure 4:
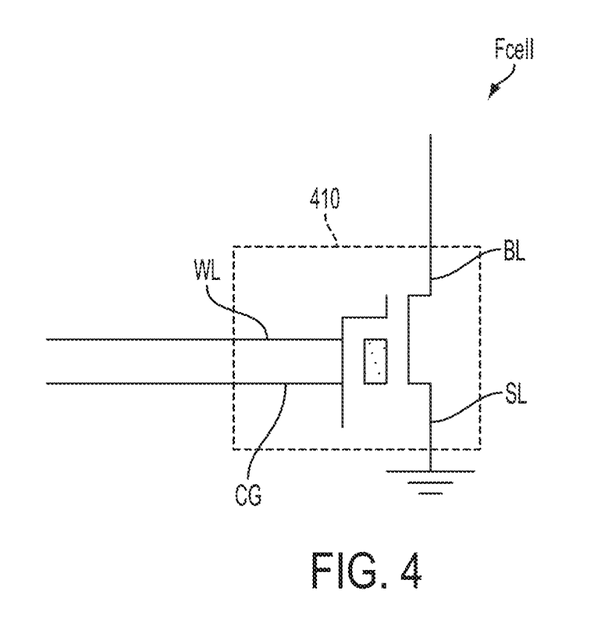
FIG. 4 is a circuit diagram of a flash memory cell of the memory array in FIG. 2, in accordance with some embodiments.

A line 185 corresponds to bit line BL in FIG. 4. Details of flash memory cells are explained with reference to FIG. 4.

Reference Current Generating Circuit

Current generating circuit 110 generates current Iref based on a current Iref0 and a current Irfef1.

A reference cell CRef010 generates a current Iref0 corresponding to current Icell when Fcell stores a low logical value. In some embodiments, reference cell CRef010 includes a flash cell Fcell in FIG. 4 programmed to store a low logical value. A line 177 corresponds to bit line BL in FIG. 4.

A stabilization circuit 130 including an inverter INV10 and a transistor N15 stabilizes current Iref0. In some embodiments, inverter INV10 includes a PMOS transistor (not shown) and an NMOS transistor (not shown). A size in terms of a width W and length L ratio of transistor N15 is selected such that a voltage at the gate and at the source of transistor N15 is at a specific value. As a result, a voltage drop across the gate and the source of transistor N15 is stabilized. A current through transistor N15 or current Iref0 is therefore stabilized.

A PMOS transistor P10 and a PMOS transistor P20 generate a current IP20 having half a value of current Iref0.

Current IP20 is a current provided by transistor P20. Current Iref0 has the same value as a current drawn by PMOS transistor P10. For illustration, PMOS transistor P10 and PMOS transistor P20 are configured as a current mirror having a ratio 2:1. As a result, IP20=½ IRef0. In some embodiments, to select a 2:1 ratio, a size of PMOS transistor P20 is designed to be about ½ that of PMOS transistor P10.

A reference cell CRef110 generates a current Iref1 corresponding to current Icell of Fcell10 when Fcell10 stores a high logical value. In some embodiments, reference cell CRef110 includes a flash cell Fcell in FIG. 4 programmed to store a high logical value. A line 187 corresponds to bit line BL in FIG. 4.

A stabilization circuit 140 with reference to current Iref1 corresponds to stabilization circuit 130 with reference to current Iref0. For example, stabilization circuit 140 stabilizes current Iref1. Stabilization circuits 130 and 140 are shown in current generating circuit 110 for illustration. Embodiments of the disclosure are not limited to a location of stabilization circuit 130 or 140. For example, at least one of stabilization circuit 130 or 140 is not part of current generating circuit 110. Further, in some embodiments, at least one of stabilization circuit 130 or 140 is not used.

A PMOS transistor P30 and a PMOS transistor P40 with reference to current Iref1 correspond to PMOS transistors P10 and P20 with reference to current Iref1, respectively. For example, PMOS transistors P30 and P40 generate a current IP40 having half a value of current Iref1. In some embodiments, PMOS transistor P30 and PMOS transistor P40 are configured as a current mirror having a ratio 2:1. As a result, IP40=½ IRef1. In some embodiments, to select a 2:1 ratio, a size of PMOS transistor P40 is designed to be about ½ that of PMOS transistor P30.

Current Iref is the sum of currents IP20 and IP40. Mathematically expressed:

$$Iref = IP20 + IP40$$
$$= \frac{1}{2}IRef0 + \frac{1}{2}IRef1$$
$$= \frac{1}{2}(IRef0 + IRef1)$$

Current Iref is thus an average of current Icell when Fcell stores a high and a low logical value. Expressed in another way, current Iref is at the middle point of current Iref0 and current Iref1.

An NMOS transistor N10 of circuit 110 and an NMOS transistor N20 of sense amplifier 120 function as a current mirror so that a current IN20 is equal to current Iref. Current IN20 is a current drawn by NMOS transistor N20. Explained in a different way, NMOS transistor N10 converts current Iref to a voltage Vref on a line 175 provided to a gate of transistor N20. In some embodiments, voltage Vref is provided to a plurality of transistors N20 of corresponding sense amplifiers 120 to sense a plurality of corresponding memory cells Fcells. For example, voltage Vref is provided to 16 transistors N20 of corresponding 16 amplifiers 120 as illustrated with reference to FIG. 2. In such a condition, a pair of reference cells CRef010 and CRef110 functions with 16 sense amplifiers 120 and 16 memory cells Fcell in FIG. 4.

Sense Amplifier Circuit

A stabilization circuit 150 of sense amplifier 120 stabilizes current Icell in the same manner as stabilization circuit 130 stabilizing current Iref0. Inverter INV30 and NMOS transistor N35 correspond to inverter INV10 and NMOS transistor N15, respectively. Stabilization circuit 150 is shown in sense amplifier 120 for illustration. Embodiments of the disclosure are not limited to a location of stabilization circuit 150. For example, stabilization circuit 150 is not part of sense amplifier 120. Further, in some embodiments, stabilization circuit 150 is not used.

A PMOS transistor P50 and a PMOS transistor P60 mirror current Icell such that a current IP60 equals to current Icell. Current IP60 is a current drawn by PMOS transistor P60.

A node NO receives current IP60 and current IN20. When current IP60 is greater than current IN20, a voltage at node NO increases such that an output circuit 160 generates an output SO having a high logical value. When current IP60 is less than current IN20, however, a voltage at node NO decreases such that output circuit 160 generates output SO having a low logical value. Because current IP60 equals current Icell and current IN20 equals current Iref, effectively, when current Icell is greater than current Iref, output SO is logically high. But when current Icell is less than current Iref, output SO is logically low.

Various embodiments of the present disclosure are advantageous over other approaches. For example, both reference cells CRef010 and CRef110 each includes a flash cell Fcell in FIG. 4. In operation, when flash cell Fcell10 is erased, reference cells CRef010 and CRef110 are also erased. As a result, when characteristics of Fcell10 change, characteristics of reference cells CRef010 and CRef110 change in a similar manner. Further, because reference current Iref is an average of currents Iref0 and Iref1, reference current Iref is consistently greater than current Iref0 and lesser than current Iref1 regardless of whether current Iref0 and/or current Iref1 changes. Consequently, if a value of cell current Icell changes due to a charge loss of repeated usages over the years, reference current Iref changes accordingly. In other words, a change in the value of current Icell is compensated by a change in the value of current Iref. As a result, a result of comparison by sense amplifier 120 between reference current Iref and cell current Iref reveals appropriate data.

In the above illustration, a value of current Iref is an average of currents Iref0 and Iref1. Expressed differently, current Iref is at the middle point of current Icell when Fcell stores a low and a high logical value. Different values of current Iref are within the scope of the present disclosure. The values of current Iref are adjusted by adjusting the size of transistors P10, P20, P30, and/or P40. Effectively, the size ratio between transistors P10 and P20 and/or between transistors P30 and P40 change accordingly. For example, based on a ratio 3:1, IP20=⅓ IP10=⅓ Iref0, and IP40=⅓ IP30=⅓ Iref1. As a result, Iref=IP20+IP40=⅓ (Iref0+Iref1). In some embodiments, based on a predetermined value of current Iref, the size ratio between transistor P10 and P20 and/or between transistor P30 and P40 is determined accordingly. In other words, the sizes of transistors P10, P20, P30, and P40 are determined accordingly to provide the predetermined current Iref.

Because current Iref is an average of current Iref0 and Iref1, current Iref changes as current Iref0 and/or current Iref1 changes. As a result, current Iref is a dynamic current, and sensing the data of Fcell10 based on current Iref is called dynamic current sensing.

Memory Array

Figure 2:
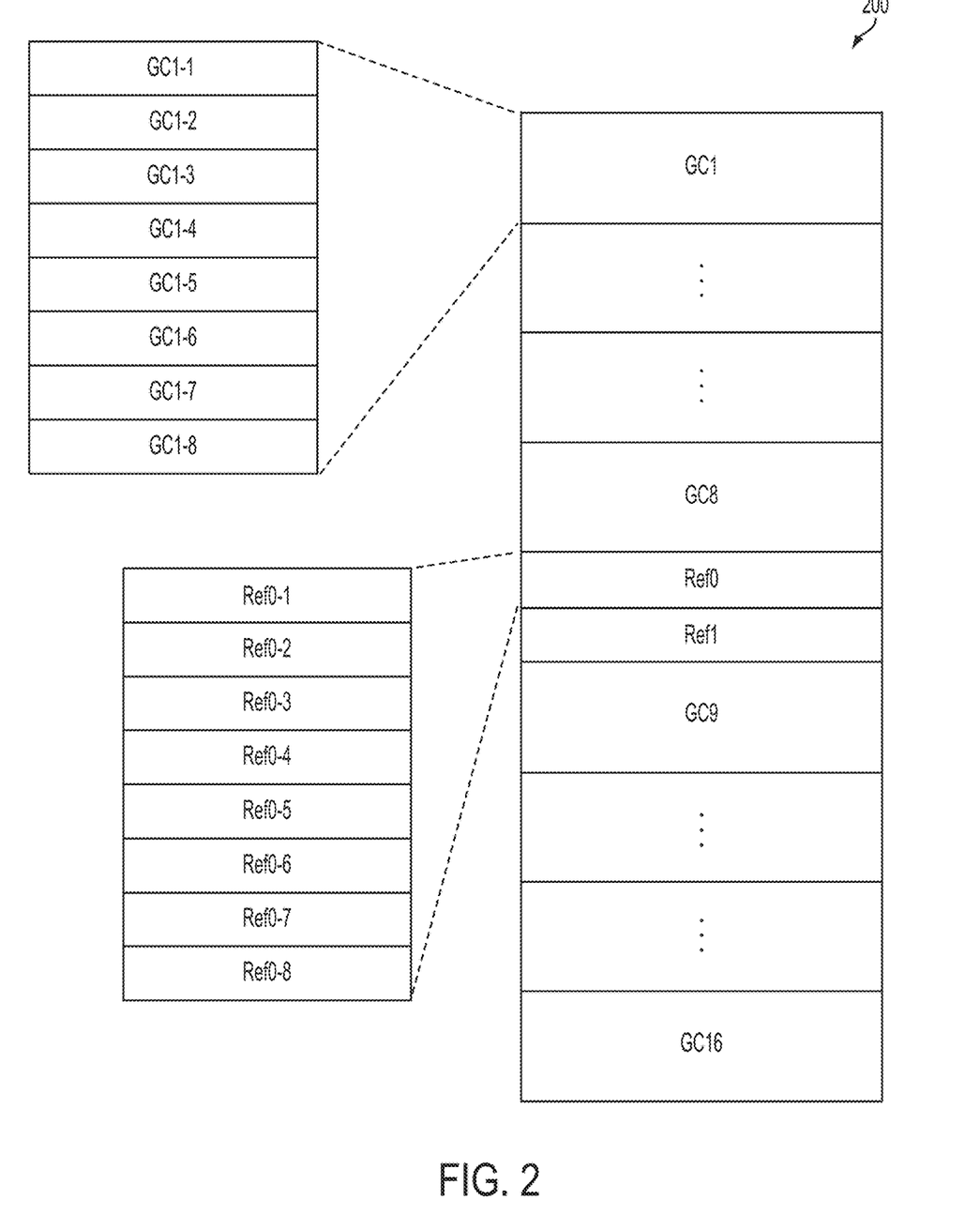
FIG. 2 is a block diagram of a memory array that uses the dynamic current sensing mechanism in FIG. 1, in accordance with some embodiments.

FIG. 2 is a block diagram of a memory array 200, in accordance with some embodiments. Memory array 200 uses the dynamic current sensing mechanism illustrated in FIG. 1. Memory array 200 includes column segments GC1 to GC16, and current reference segments Ref0 and Ref1.

With reference to column segments GC1 to GC16, for simplicity, details of only segment GC1 are shown, but are also applicable to segments GC2 to GC16. In some embodiments, segment GC1 includes 64 columns divided into 8 (sub) segments GC1-1 to GC1-8. Further, each segments GC1-1 to GC1-8 includes 8 columns (not shown).

Also for simplicity, details of reference current segment Ref0 are shown, but are also applicable to current reference segment Ref1. In some embodiments, segment Ref0 includes 8 columns Ref0-1 to Ref0-8. Similarly, segment Ref1 also includes 8 columns Ref1-1 to Ref1-8 (not shown).

In some embodiments, in operation, one column in each of a corresponding segment GC1 to GC16 is active at a time and functions with a corresponding pair of columns of corresponding current reference segments Ref0 and Ref1. Effectively, 16 columns from 16 segments GC1 to GC16 function with a pair of columns of segments Ref0 and Ref1. For example, one column in segment Ref0 and one column in segment Ref1 operate as a pair and function with a corresponding segment GC1-1 to GC1-8 of segment GC1, a corresponding segment GC2-1 to GC2-8 (not shown) of segment GC2, a corresponding segment GC3-1 to GC3-8 (not shown) of segment GC3, etc., for a total of 16 columns of segments GC1 to GC16. For simplicity of discussion, one column in a segment is described, but the description is applicable to the other 15 columns. For example, a pair comprising columns Ref0-1 and Ref1-1 function with segment GC1-1 of GC1. A pair comprising columns Ref0-2 and Ref1-2 function with segment GC1-2 of GC1, and a pair comprising columns Ref0-3 and Ref1-3 function with segment GC1-3 of GC1, etc.

For another example, when any one of 8 columns in segment GC1-1 is active, a corresponding pair of Ref0-1 and Ref1-1 is selected to function with the active column in segment GC1-1. For another example, when any one of 8 columns in segment GC1-2 is active, a corresponding pair of Ref0-2 and Ref1-2 is selected to function with the active column in segment GC1-2, and when any one of 8 columns in segment GC1-3 is active, a corresponding pair of Ref0-3 and Ref1-3 is selected to function with the active column in segment GC1-3, etc.

Memory Array and Sense Amplifier Circuit

Figure 3:
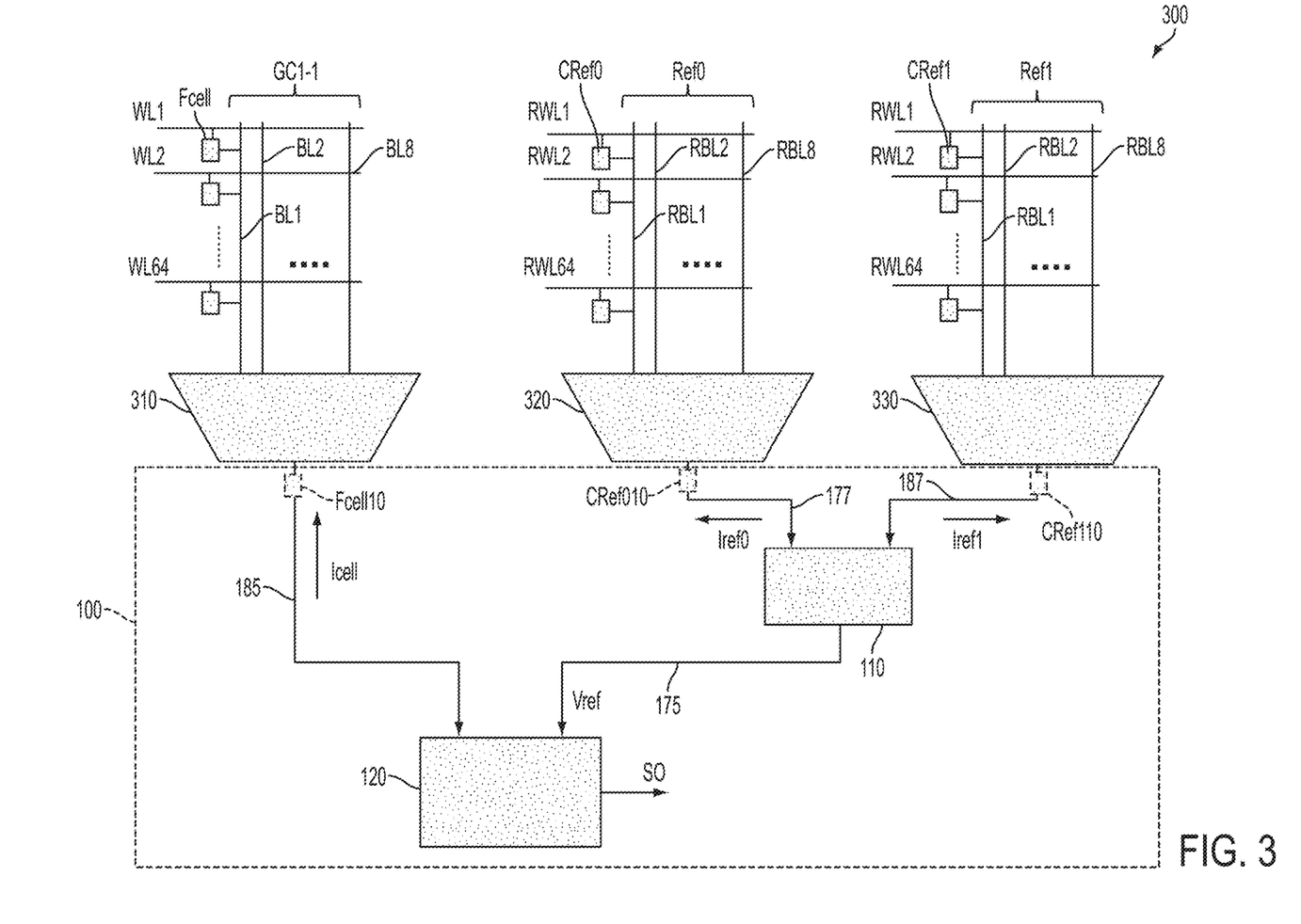
FIG. 3 is a diagram of a circuit illustrating how the circuit in FIG. 1 is used with the memory array in FIG. 2, in accordance with some embodiments.

FIG. 3 is a diagram of a circuit 300, in accordance with some embodiments. Circuit 300 is used to illustrate how circuit 100 in FIG. 1 is used in conjunction with memory array 200 in FIG. 2. For illustration, segment GC1-1 of segment GC1 of memory array 200 is used with segments Ref0 and Ref1, and is shown. Segments GC1-2 to GC1-8 of GC1 used with segments Ref0 and Ref1 are in a manner similar to segment GC1-1 being used with segments Ref0 and Ref1. In some embodiments, segments GC1-2 to GC1-8 of segment GC1 are also input into a multiplexer 310 as segment GC1-1. Effectively, 8 segments GC1-1 to GC1-8 of segments GC1 are input into multiplexer 310. Segments GC1-2 to GC1-8 are used with segments Ref0 and Ref1 in a manner similar to segment GC1-1 being used with segments Ref0 and Ref1. Segments GC2 to GC16 used with segments Ref0 and Ref1 are in a similar manner as segment GC1 being used with segments Ref0 and Ref1. Effectively, in some embodiments, 16 multiplexers 310 correspond to 16 segments GC1 to GC16.

Segment GC1-1 includes 8 columns each corresponding to a bit line BL in FIG. 4. As illustratively shown, segment GC1-1 includes 8 bit line BL1 to BL8. In some embodiments, each bit line BL1 to BL8 is coupled with 64 flash memory cells Fcell. For simplicity, flash memory cells Fcell coupled with bit line BL1 are shown, and one memory cell Fcell of bit line BL1 is labeled.

Effectively, in the illustration of FIG. 3, the flash memory cells coupled with bit lines BL1 to BL8 form an array having 8 columns and 64 rows. Flash memory cells in a row are coupled with a word line WL in FIG. 4. As illustratively shown, 64 rows of GC1-1 correspond to 64 word lines WL1 to WL64.

Similarly, segment Ref0 includes 8 bit line RBL1 to RBL8. In some embodiments, each bit line RBL1 to RBL8 of segment Ref0 is also coupled with 64 reference cells CRef0. For simplicity, reference cells of bit line RBL1 of section Ref0 are shown, and one reference cell CRef0 is labeled. In some embodiments, a reference cell CRef0 includes a flash memory cell Fcell programmed with a low logical value. Effectively, the reference cells CRef0 coupled with bit lines RBL1 to RBL8 of segment Ref0 form an array with 8 columns and 64 rows. Reference cells in a row of section Ref0 are coupled with a word line of section Ref0. As illustratively shown, 64 rows in segment Ref0 correspond to 64 word lines RWL1 to RWL64.

Segment Ref1 also includes 8 bit lines RBL1 to RBL1. Each bit line RBL1 to RBL8 of Ref1 is coupled with 64 reference cells CRef1. For simplicity, reference cells coupled with bit line RBL1 of segment Ref1 are shown, and one reference cell CRef1 is labeled. In some embodiments, a reference cell CRef1 includes a flash memory cell Fcell programmed with a high logical value. Effectively, the reference cells CRef1 coupled with bit line RBL1 to RBL8 of segment Ref1 form an array with 8 columns and 64 rows. Reference cells CRef1 in a row of section Ref1 are coupled with a word line of section Ref1. As illustratively shown, 64 rows in segment Ref1 correspond to 64 word lines RWL1 to RWL64. Because each of word lines RWL1 to RWL64 also controls a row of reference cells CRef0, each of word lines RWL1 to RWL64 controls the same row of Ref0 and Ref1.

In FIG. 3, 64 rows in segment GC1-1 and segments Ref0, Ref1 are used for illustration. A different number of rows is within the scope of the present disclosure.

In operation, a multiplexer 310 selects a memory cell Fcell in a column and a row of segment GC1-1 to be sensed. For illustration, multiplexer 310 selects memory cell Fcell10 represented by a dashed box that is coupled with word line WL1 and bit line BL1 of segment GC-1.

A multiplexer 320 selects a reference cell CRef0 in a column and a row of segment Ref0 to be used in sensing the selected memory cell Fcell10. For illustration, multiplexer 320 selects reference cell CRef010 represented by a dashed box that is coupled with word line RWL1 and bit line RBL1 of segment Ref0.

In some embodiments, the column of the selected reference cell CRef010 corresponds to the selected column of the selected memory cell Fcell10. For example, because the selected memory cell Fcell10 is coupled with bit lint BL1 of segment GC1-1, the selected reference cell CRef010 is also coupled with bit line RBL1 of segment Ref0. But if the selected memory cell Fcell10 is coupled with another bit line of segment GC1-1, such as bit line BLi where i is an integer number, the selected reference cell CRef010 is also coupled with a corresponding read bit line RBLi of segment Ref0.

A multiplexer 330 selects a reference cell CRef1 in a column and a row of segment Ref1 to be used with the selected reference cell CRef010 to sense the selected memory cell Fcell10. For illustration, multiplexer 330 selects reference cell Cref110 represented by a dashed box. Further, because the selected memory cell Fcell10 and reference cell CRef010 are coupled with corresponding bit lines BL1 and RBL1, in some embodiments, the selected reference cell CRef110 is also coupled with corresponding read bit line RBL1 of section Ref1.

As illustratively shown in FIG. 3, memory cell Fcell10, reference cell CRef010, reference cell CRef110, current generating circuit 110, and sense amplifier 120 constitute circuit 100 in FIG. 1.

Multiplexers 310, 320, and 330 are used for illustration. Other ways to identify a corresponding flash memory cell Fcell, reference cell CRef010, or CRef100 are within the scope of various embodiments. For example, in some embodiments, a flash memory cell, a reference cell CRef010, or CRef110 is identified by a decoder based on corresponding address of the corresponding cell.

Flash Memory Cell, Circuit Diagram

FIG. 4 is a circuit diagram of a flash memory cell Fcell, in accordance with some embodiments. Memory cell Fcell includes a transistor 410 having four terminals serving as a bit line BL, a source line SL, a word line WL, and a control gate CG. Memory cell Fcell has a split gate region in which a first half of the gate region is coupled with word line WL and a second half of the gate region is coupled with control gate CG. When both word line WL and control gate CG are activated, for example with a high logical value, memory cell Fcell is activated. Source line SL is grounded.

In some embodiments, memory cell Fcell is programmed with a low logical value to generate reference cell CRef010, or is programmed with a high logical value to generate reference cell CRef110. In such a situation, word line WL corresponds to one of word line RWL1 to RWL64 in FIG. 3, and bit line BL corresponds to one of bit line RBL1 to RBL8.

Flash memory cell Fcell in FIG. 4 is used for illustration. Other memory cells and/or other configurations of flash memory cells are within the contemplated scope of the present disclosure.

Method

Figure 5:
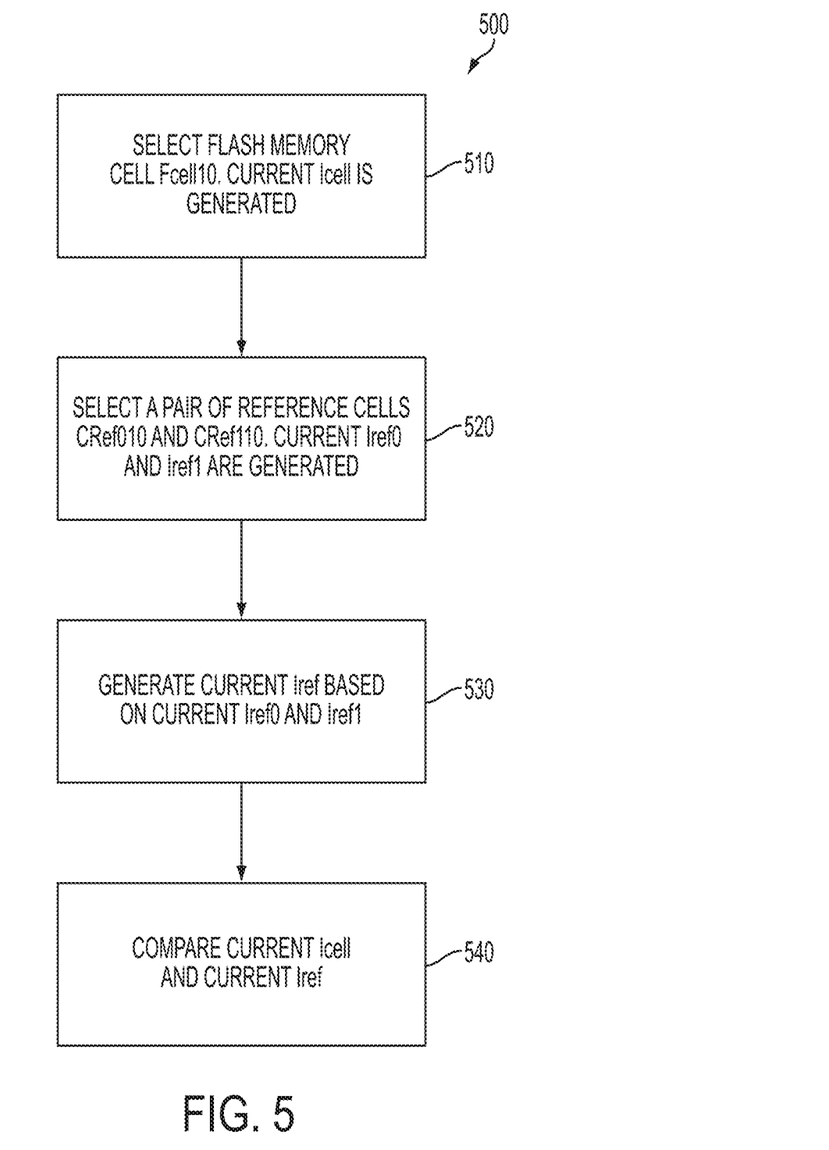
FIG. 5 is a flow chart of a method illustrating operations of the circuit in FIG. 3, in accordance with some embodiments.

FIG. 5 is a flowchart of a method 500, in accordance with some embodiments. Method 500 is used to illustrate operations of circuit 300 in FIG. 3.

In operation 510, flash memory cell Fcell10 is selected to be sensed. In some embodiments, a word line and a bit line corresponding flash memory cell Fcell10 are activated, and multiplexer 310 selects flash memory cell Fcell10.

In operation 520, a pair of reference cells CRef010 and CRef110 is selected to be used in sensing the selected memory cell Fcell10. In some embodiments, a word line and a bit line corresponding to reference cell CRef010 are activated, and multiplexer 320 selects reference cell CRef010. Further, a word line and a bit line corresponding to reference cell CRef110 are activated, and multiplexer 330 selects reference cell CRef110.

In operation 530, current generating circuit 100 in FIG. 1, based on reference cells CRef010 and CRef110, generates current Iref and voltage Vref for use by sense amplifier 120.

In operation 540, sense amplifier 120, based on current Icell generated by flash memory cell Fcell10 and reference current Iref, generates output SO. The logical value on output SO indicates a corresponding logical value stored in flash memory cell Fcell10.

In some embodiments, a memory array includes a plurality of column segments, each column segment including a plurality of columns of memory cells, a plurality of sense amplifiers, wherein each sense amplifier is selectively coupled to each column of the plurality of columns of a corresponding column segment of the plurality of column segments, a plurality of first reference cells, a plurality of second reference cells, and a reference current circuit. The reference current circuit is configured to generate a reference current based on a first current generated by a first reference cell of the plurality of first reference cells programmed to a low logical value and a second current generated by a second reference cell of the plurality of second reference cells programmed to a high logical value, and each sense amplifier of the plurality of sense amplifiers is configured to generate a mirror current based on the reference current, and generate a logical value based on a comparison of the mirror current to a cell current received from a memory cell of a column of the plurality of columns of the corresponding column segment of the plurality of column segments. In some embodiments, the memory array includes a plurality of first word lines, wherein each first word line of the plurality of first word lines is coupled to the memory cells of a corresponding row of a plurality of rows of memory cells of a column segment of the plurality of column segments, and a plurality of second word lines, wherein each second word line of the plurality of second word lines is coupled to the first reference cells of a corresponding row of a plurality of rows of first reference cells of the plurality of first reference cells, and to the second reference cells of a corresponding row of a plurality of rows of second reference cells of the plurality of second reference cells. In some embodiments, the memory array is configured to activate a second word line of the plurality of second word lines when a corresponding first word line of the plurality of first word lines is activated. In some embodiments, the plurality of first word lines includes a total of 64 first word lines, and the plurality of second word lines includes a total of 64 second word lines. In some embodiments, each row of the plurality of rows of memory cells of the column segment of the plurality of column segments includes a total of eight memory cells, each row of the plurality of rows of first reference cells of the plurality of first reference cells includes a total of eight first reference cells, and each row of the plurality of rows of second reference cells of the plurality of second reference cells includes a total of eight second reference cells. In some embodiments, the plurality of first reference cells includes a plurality of first bit lines corresponding to a plurality of columns of first reference cells of the plurality of first reference cells, the plurality of second reference cells includes a plurality of second bit lines corresponding to a plurality of columns of second reference cells of the plurality of second reference cells, a column segment of the plurality of column segments includes a plurality of third bit lines corresponding to the plurality of columns of memory cells, and each of the plurality of first bit lines, the plurality of second bit lines, and the plurality of third bit lines includes a same number of bit lines. In some embodiments, the memory array includes a first multiplexer coupled between the plurality of first reference cells and the reference current circuit, a second multiplexer coupled between the plurality of second reference cells and the reference current circuit, and a third multiplexer coupled between the column segment of the plurality of column segments and a corresponding sense amplifier of the plurality of sense amplifiers. In some embodiments, each of the first through third multiplexers is configured to select a same numbered bit line of the corresponding pluralities of first through third bit lines during a read operation. In some embodiments, the plurality of column segments includes a total of 16 column segments, and the plurality of sense amplifiers includes a total of 16 sense amplifiers. In some embodiments, the reference current circuit includes a first transistor configured to generate a reference voltage based on the reference current, and each sense amplifier of the plurality of sense amplifiers includes a second transistor configured to generate the mirror current based on the reference voltage. In some embodiments, each memory cell of the plurality of columns of memory cells of each column segment of the plurality of column segments, each first reference cell of the plurality of first reference cells, and each second reference cell of the plurality of second reference cells includes a MONOS flash memory cell.

In some embodiments, a memory array includes a plurality of columns of first reference cells, a plurality of first bit lines corresponding to the plurality of columns of first reference cells, a plurality of columns of second reference cells, a plurality of second bit lines corresponding to the plurality of columns of second reference cells, a plurality of column segments, each column segment including a plurality of columns of memory cells and a corresponding plurality of third bit lines, a plurality of sense amplifiers, wherein each sense amplifier is selectively coupled to each third bit line of the plurality of third bit lines of a corresponding column segment of the plurality of column segments, and a reference current circuit selectively coupled to each of the plurality of first bit lines and the plurality of second bit lines. The reference current circuit is configured to generate a reference current based on a first current generated by a first reference cell of the plurality of first reference cells programmed to a low logical value and a second current generated by a second reference cell of the plurality of second reference cells programmed to a high logical value, and each sense amplifier of the plurality of sense amplifiers is configured to generate a mirror current based on the reference current, and generate a logical value based on a comparison of the mirror current to a cell current received from a memory cell of a column of the plurality of columns of the corresponding column segment of the plurality of column segments. In some embodiments, the memory array is configured to select a same numbered bit line of the corresponding pluralities of first through third bit lines during a read operation. In some embodiments, the memory array includes a plurality of first word lines, wherein each first word line of the plurality of first word lines is coupled to the memory cells of a corresponding row of a plurality of rows of memory cells of a column segment of the plurality of column segments, and a plurality of second word lines, wherein each second word line of the plurality of second word lines is coupled to the first reference cells of a corresponding row of a plurality of rows of first reference cells of the plurality of columns of first reference cells, and to the second reference cells of a corresponding row of a plurality of rows of second reference cells of the plurality of columns of second reference cells, the the memory array is configured to activate a second word line of the plurality of second word lines when a corresponding first word line of the plurality of first word lines is activated. In some embodiments, each of the pluralities of first through third bit lines includes a total of eight bit lines. In some embodiments, the reference current circuit includes a first NMOS transistor coupled to a ground node, thereby configured to generate a reference voltage based on the reference current, and each sense amplifier of the plurality of sense amplifiers includes a second NMOS transistor coupled to the ground node, thereby configured to generate the mirror current based on the reference voltage.

In some embodiments, a data sensing method includes generating a cell current in a memory cell of a sub-segment of a plurality of sub-segments of a column segment of a plurality of column segments of a memory array, generating a first current in a first reference cell of a plurality of first reference cells programmed to a low logical value and a second current in a second reference cell of a plurality of second reference cells programmed to a high logical value, generating a reference current based on the first current and the second current, and using a sense amplifier to mirror the reference current and generate a logical value based on a comparison of the mirror current to the cell current. The sense amplifier is one sense amplifier of a plurality of sense amplifiers, and each sense amplifier is configured to mirror the reference current. In some embodiments, generating the cell current in the memory cell includes activating a first word line of a plurality of first word lines coupled to the column segment of the plurality of column segments, generating the first current in the first reference cell of the plurality of first reference cells includes activating a second word line of a plurality of second word lines coupled to the plurality of first reference cells, and generating the second current in the second reference cell of the plurality of second reference cells includes activating the second word line of the plurality of second word lines further coupled to the plurality of second reference cells. In some embodiments, the method includes conducting the reference current through a first transistor, thereby generating a reference voltage, and using each sense amplifier of the plurality of sense amplifiers to mirror the reference current includes receiving the reference voltage at a gate of a second transistor. In some embodiments, each of generating the cell current in the memory cell, generating the first current in the first reference cell, and generating the second current in the second reference cell includes generating the corresponding current in a flash memory cell.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source.

The above illustrations include exemplary operations, but the operations are not necessarily performed in the order shown. Operations may be added, replaced, changed order, and/or eliminated as appropriate, in accordance with the spirit and scope of disclosed embodiments.

What is claimed is:

1. A memory array comprising:
   a plurality of column segments, each column segment comprising a plurality of columns of memory cells;
   a plurality of sense amplifiers, wherein each sense amplifier is selectively coupled to each column of the plurality of columns of a corresponding column segment of the plurality of column segments;
   a plurality of first reference cells;
   a plurality of second reference cells; and
   a reference current circuit,
   wherein
   the reference current circuit is configured to generate a reference current based on a first current generated by a first reference cell of the plurality of first reference cells programmed to a low logical value and a second current generated by a second reference cell of the plurality of second reference cells programmed to a high logical value, and
   each sense amplifier of the plurality of sense amplifiers is configured to
      generate a mirror current based on the reference current, and
      generate a logical value based on a comparison of the mirror current to a cell current received from a memory cell of a column of the plurality of columns of the corresponding column segment of the plurality of column segments.

2. The memory array of claim 1, further comprising:
   a plurality of first word lines, wherein each first word line of the plurality of first word lines is coupled to the memory cells of a corresponding row of a plurality of rows of memory cells of a column segment of the plurality of column segments; and
   a plurality of second word lines, wherein each second word line of the plurality of second word lines is coupled to the first reference cells of a corresponding row of a plurality of rows of first reference cells of the plurality of first reference cells, and to the second reference cells of a corresponding row of a plurality of rows of second reference cells of the plurality of second reference cells.

3. The memory array of claim 2, wherein the memory array is configured to activate a second word line of the plurality of second word lines when a corresponding first word line of the plurality of first word lines is activated.

4. The memory array of claim 2, wherein
   the plurality of first word lines comprises a total of 64 first word lines, and
   the plurality of second word lines comprises a total of 64 second word lines.

5. The memory array of claim 2, wherein
   each row of the plurality of rows of memory cells of the column segment of the plurality of column segments comprises a total of eight memory cells,
   each row of the plurality of rows of first reference cells of the plurality of first reference cells comprises a total of eight first reference cells, and
   each row of the plurality of rows of second reference cells of the plurality of second reference cells comprises a total of eight second reference cells.

6. The memory array of claim 1, wherein
   the plurality of first reference cells comprises a plurality of first bit lines corresponding to a plurality of columns of first reference cells of the plurality of first reference cells,
   the plurality of second reference cells comprises a plurality of second bit lines corresponding to a plurality of columns of second reference cells of the plurality of second reference cells,
   a column segment of the plurality of column segments comprises a plurality of third bit lines corresponding to the plurality of columns of memory cells, and
   each of the plurality of first bit lines, the plurality of second bit lines, and the plurality of third bit lines comprises a same number of bit lines.

7. The memory array of claim 6, further comprising:
   a first multiplexer coupled between the plurality of first reference cells and the reference current circuit,
   a second multiplexer coupled between the plurality of second reference cells and the reference current circuit, and
   a third multiplexer coupled between the column segment of the plurality of column segments and a corresponding sense amplifier of the plurality of sense amplifiers.

8. The memory array of claim 7, wherein each of the first through third multiplexers is configured to select a same numbered bit line of the corresponding pluralities of first through third bit lines during a read operation.

9. The memory array of claim 1, wherein
   the plurality of column segments comprises a total of 16 column segments, and
   the plurality of sense amplifiers comprises a total of 16 sense amplifiers.

10. The memory array of claim 1, wherein
    the reference current circuit comprises a first transistor configured to generate a reference voltage based on the reference current, and
    each sense amplifier of the plurality of sense amplifiers comprises a second transistor configured to generate the mirror current based on the reference voltage.

11. The memory array of claim 1, wherein each memory cell of the plurality of columns of memory cells of each column segment of the plurality of column segments, each first reference cell of the plurality of first reference cells, and each second reference cell of the plurality of second reference cells comprises a metal-oxide nitride-oxide semiconductor (MONOS) flash memory cell.

12. A memory array comprising:
    a plurality of columns of first reference cells;
    a plurality of first bit lines corresponding to the plurality of columns of first reference cells;
    a plurality of columns of second reference cells;
    a plurality of second bit lines corresponding to the plurality of columns of second reference cells;
    a plurality of column segments, each column segment comprising a plurality of columns of memory cells and a corresponding plurality of third bit lines;
    a plurality of sense amplifiers, wherein each sense amplifier is selectively coupled to each third bit line of the plurality of third bit lines of a corresponding column segment of the plurality of column segments; and
    a reference current circuit selectively coupled to each of the plurality of first bit lines and the plurality of second bit lines,
    wherein
    the reference current circuit is configured to generate a reference current based on a first current generated by a first reference cell of the plurality of first reference cells programmed to a low logical value and a second current generated by a second reference cell of the plurality of second reference cells programmed to a high logical value, and each sense amplifier of the plurality of sense amplifiers is configured to
  generate a mirror current based on the reference current, and
  generate a logical value based on a comparison of the mirror current to a cell current received from a memory cell of a column of the plurality of columns of the corresponding column segment of the plurality of column segments.

13. The memory array of claim 12, wherein the memory array is configured to select a same numbered bit line of the corresponding pluralities of first through third bit lines during a read operation.

14. The memory array of claim 12, further comprising;
a plurality of first word lines, wherein each first word line of the plurality of first word lines is coupled to the memory cells of a corresponding row of a plurality of rows of memory cells of a column segment of the plurality of column segments; and
a plurality of second word lines, wherein each second word line of the plurality of second word lines is coupled to the first reference cells of a corresponding row of a plurality of rows of first reference cells of the plurality of columns of first reference cells, and to the second reference cells of a corresponding row of a plurality of rows of second reference cells of the plurality of columns of second reference cells,
wherein the memory array is configured to activate a second word line of the plurality of second word lines when a corresponding first word line of the plurality of first word lines is activated.

15. The memory array of claim 12, wherein each of the pluralities of first through third bit lines comprises a total of eight bit lines.

16. The memory array of claim 12, wherein
the reference current circuit comprises a first NMOS transistor coupled to a ground node, thereby configured to generate a reference voltage based on the reference current, and
each sense amplifier of the plurality of sense amplifiers comprises a second NMOS transistor coupled to the ground node, thereby configured to generate the mirror current based on the reference voltage.

17. A data sensing method comprising:
generating a cell current in a memory cell of a sub-segment of a plurality of sub-segments of a column segment of a plurality of column segments of a memory array;
generating a first current in a first reference cell of a plurality of first reference cells programmed to a low logical value and a second current in a second reference cell of a plurality of second reference cells programmed to a high logical value;
generating a reference current based on the first current and the second current; and
using a sense amplifier to mirror the reference current and generate a logical value based on a comparison of the mirror current to the cell current,
wherein
  the sense amplifier is one sense amplifier of a plurality of sense amplifiers, and
  each sense amplifier is configured to mirror the reference current.

18. The method of claim 17, wherein
the generating the cell current in the memory cell comprises activating a first word line of a plurality of first word lines coupled to the column segment of the plurality of column segments,
the generating the first current in the first reference cell of the plurality of first reference cells comprises activating a second word line of a plurality of second word lines coupled to the plurality of first reference cells, and
the generating the second current in the second reference cell of the plurality of second reference cells comprises activating the second word line of the plurality of second word lines further coupled to the plurality of second reference cells.

19. The method of claim 17, further comprising conducting the reference current through a first transistor, thereby generating a reference voltage,
wherein the using each sense amplifier of the plurality of sense amplifiers to mirror the reference current comprises receiving the reference voltage at a gate of a second transistor.

20. The method of claim 17, wherein each of the generating the cell current in the memory cell, the generating the first current in the first reference cell, and the generating the second current in the second reference cell comprises generating the corresponding current in a flash memory cell.

* * * * *